United States Patent [19]

Smith et al.

[11] Patent Number: 4,842,892
[45] Date of Patent: Jun. 27, 1989

[54] METHOD FOR DEPOSITING AN N+ AMORPHOUS SILICON LAYER ONTO CONTAMINATED SUBSTRATE

[75] Inventors: Donald L. Smith, Palo Alto; Andrew S. Alimonda, Los Altos, both of Calif.

[73] Assignee: Xerox Corporation, Stamford, Conn.

[21] Appl. No.: 101,451

[22] Filed: Sep. 29, 1987

[51] Int. Cl.⁴ .......................... B05D 3/06; B05D 1/36
[52] U.S. Cl. ........................................ 427/39; 427/402
[58] Field of Search ................................ 427/39, 402

[56] References Cited

U.S. PATENT DOCUMENTS

| | | | |
|---|---|---|---|
| 4,485,125 | 11/1984 | Izu et al. | 427/39 |
| 4,582,721 | 4/1986 | Yoshino et al. | 427/39 |
| 4,634,601 | 1/1987 | Hamakawa et al. | 427/39 |
| 4,705,913 | 11/1987 | Campbell, III | 427/39 |
| 4,743,750 | 5/1988 | Komatsu et al. | 430/84 |

*Primary Examiner*—Norman Morgenstern
*Assistant Examiner*—Margaret Bueker
*Attorney, Agent, or Firm*—Serge Abend

[57] ABSTRACT

A method of depositing a delamination bubble-free PECVD thin film n+ amorphous silicon layer, from the decomposition of a gaseous mixture of silane and phosphine, upon a substrate having one or more thin film layers thereon, wherein there is contamination upon the exposed surface of the outer thin film layer, comprising purging the plasma chamber with pure silane gas, igniting the plasma and then introducing the gaseous mixture of silane and phosphine into the plasma chamber to complete the formation of the n+ layer.

4 Claims, 1 Drawing Sheet

METHOD FOR DEPOSITING AN N+ AMORPHOUS SILICON LAYER ONTO CONTAMINATED SUBSTRATE

FIELD OF THE INVENTION

This invention relates to the formation of amorphous silicon thin film electronic devices and, in particular, a method for depositing an n+ amorphous silicon layer in such a way as to prevent the generation of delamination bubbles in the n+ layer.

BACKGROUND OF THE INVENTION

Fabrication of thin film transistors and other thin film devices entails the deposition of a number of thin layers upon one another and their patterning by various standard methods. Amorphous silicon thin film devices are commonly made by the PECVD (plasma enhanced chemical vapor deposition) method because it is a low temperature process compatible with these materials. Simply stated, PECVD employs an RF plasma for decomposing gases whose constituents chemically react and deposit upon a substrate. In accordance with this method, it is possible to deposit layers of different materials, one upon the other, by simply changing the reactant gases. Then the substrate is removed from the plasma chamber for patterning the exposed surface layer, which is most commonly accomplished by coating it with a photoresist layer, photolithographically exposing the photoresist, removing selected areas of the photoresist to expose the underlying layer, wet etching the layer, and finally removing the remaining photoresist.

When making thin film amorphous silicon electronic devices it is often necessary to deposit a layer of n+ amorphous silicon. Generally, no problems are encountered when depositing the n+layer as one of a series of layers, in an evacuated chamber. However, we have observed that a serious defect, in the form of delamination bubbles, arises when the substrate has been exposed to air immediately prior to the n+deposition step(see the photograph of FIG. 1). In that 170X photograph there can be seen stripes of amorphous silicon 10 (deposited upon a silicon nitride layer) with an overlying layer of n+ morphous silicon 12. Randomly appearing circles 14 throughout the photo represent delamination bubbles of various sizes. This defect causes major problems, namely, the lack of good ohmic contact between the n+ and its underlying layer, and the disintegration of the n+ domes in subsequent processing, such as by being crushed during contact printing of a lithographic mask, so as to generate opens through the n+ layer and a profusion of contaminating particles.

It is the primary object of this invention to provide an inexpensive fabrication technique which will eliminate the formation of delamination bubbles in the n+ amorphous silicon layer, but which will not introduce any undesirable constraints on the existing thin film fabrication process.

It is another object of this invention to improve the interface bonding between the n+ morphous silicon layer and its contaminated underlying layer.

SUMMARY OF THE INVENTION

These objects may be achieved, in one form of the method of our invention, by the PECVD formation of a thin film n+ amorphous silicon layer from the decomposition of a gaseous mixture of silane and phosphine, upon a substrate having one or more thin film layers thereon, wherein there is contamination upon the exposed surface of the substrate. Our method comprises the steps of placing said substrate in a plasma chamber, flowing silane alone into the chamber for a purge period, igniting a plasma in the chamber, so as to decompose the silane and to deposit intrinsic amorphous silicon upon the exposed contaminated surface, and then flowing a gaseous mixture of silane and phosphine into the chamber, so as to decompose the silane and phosphine and to deposit n+ morphous silicon upon the intrinsic amorphous silicon.

BRIEF DESCRIPTION OF THE DRAWINGS

Other objects and further features and advantages of our invention will be apparent from the following description, considered together with the accompanying drawings, wherein.

DETAILED DESCRIPTION OF THE INVENTION

Figure 2:
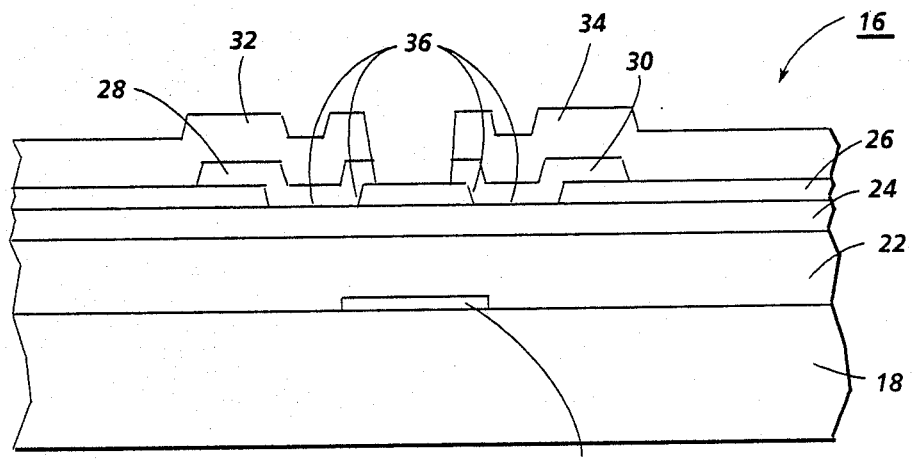
FIG. 2 is a schematic side sectional view of a standard thin film transistor.

In the side sectional view of FIG. 2 there is shown a standard thin film transistor 16 comprising a substrate 18, a gate electrode 20, a gate ("bottom") dielectric layer 22, a charge transport channel 24, a passivating ("top") dielectric layer 26, a source contact pad 28, a drain contact pad 30, a conductive source contact and line 32, and a conductive drain contact and line 34. Although the present invention is described with particular reference to a thin film transistor, it should be borne in mind that this invention has application to any amorphous silicon thin film device, such as resistors, diodes, sensors and the like, an relates broadly to the prevention of delamination bubbles spontaneously forming in n+ amorphous silicon layers.

When the method of the present invention is incorporated in a standard amorphous silicon thin film transistor, an n+ amorphous silicon layer is deposited upon the top nitride layer 26 and through vias 36 for forming the source and drain contact pads 28 and 30. The n+ is deposited from the decomposition of silane and phosphine. It is during this stage of the process that the delamination bubble problem arises. After the n+ amorphous silicon layer has been deposited, it is patterned with photoresist 38 to form the contact pads (note FIG. 3). It is during this stage of the process that the problem is aggravated.

Figure 1:
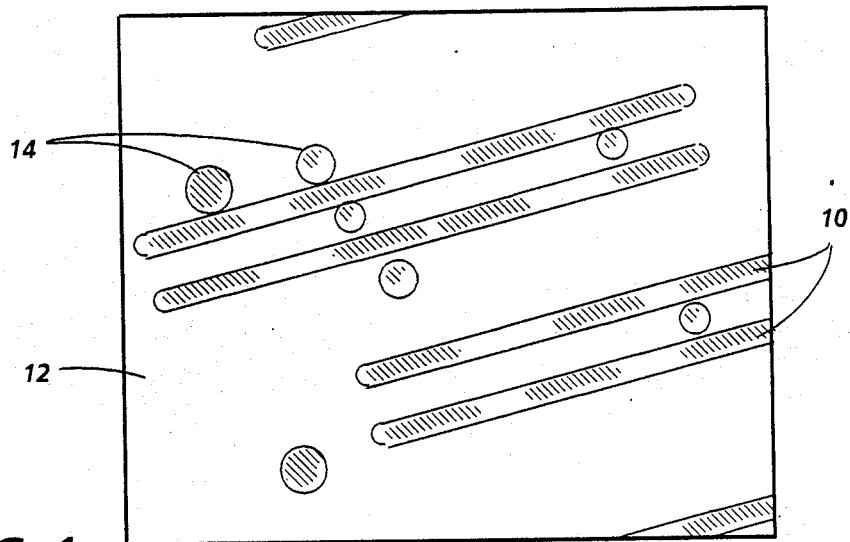
FIG. 1 is a graphical representation of a 170X photograph showing random bubbles in an n+silicon film.
Figure 3:
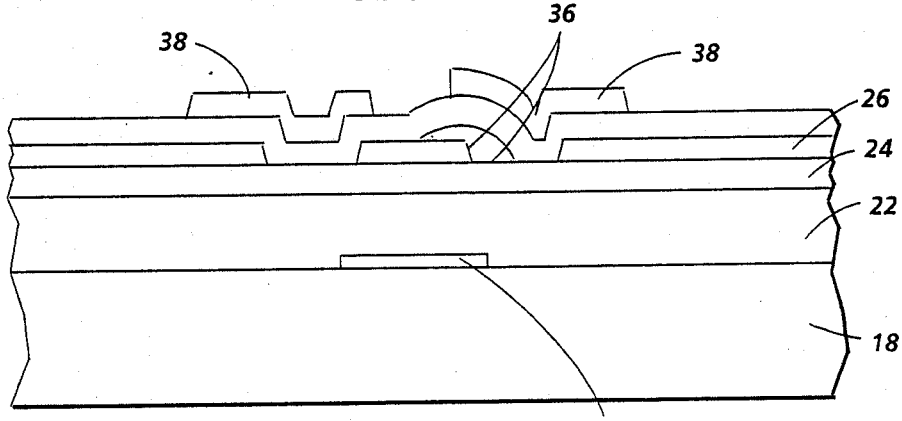
FIG. 3 is a schematic side sectional view of a thin fim transistor during its processing, showing a delamination bubble.

As can be seen in FIG. 1, delamination bubbles randomly appear throughout the n+ layer. The bubbles are dome-shaped and are about 1 micron high and 10 to 30 microns in diameter. A situation illustrated in FIG. 3, is considered to be a worst case, because the bubble straddles the top nitride 26 and the intrinsic amorphous silicon channel 24 over the via 36. The drawing shows the bubble in the n+ layer before the layer is formed into contact pads with the patterned photoresist 38. Thus, when the n+ is etched, in those areas unprotected by the patterned photoresist, the etchant will have an opportunity to eat away and undercut the edge of the n+ contact pad, interfering with proper pad definition. If the etchant migrates under the n+ contact pad it may even attack the amorphous silicon channel. In any event, the bubble itself raises the pad and prevents a good ohmic contact between the pad and the channel. Furthermore, if too much of the pad is etched away in the region over the via, it is possible that aluminum may deposit directly upon the intrinsic amorphous silicon channel, aggravating the problem by effectively destroying the TFT, because aluminum reacts adversely with the intrinsic amorphous silicon, by changing its conductivity.

We believe that the bubbles are caused by a combination of poor adhesion of the n+ to the top nitride and a lifting force, such as is provided by the compressive stresses within the n+ layer and perhaps also hydrogen pressure buildup between these layers. Since we have observed this phenomenon uniquely occurring in n+ films, we are convinced that the poor adhesion is caused by a reaction between surface contaminants and the phosphine doping gas. Even in the absence of bubble formation, the poor adhesion itself may adversely affect the ohmic contact.

We have isolated the root cause of the problem to surface contamination, because we have observed that for a top layer freshly grown in a vacuum and not exposed to air, the deposition of an n+ layer thereupon in the known manner will not adversely affect adhesion. We also have observed that delamination bubbles appear in the n+ layer after lithography and wet etching, which steps entail removal of the substrate from the vacuum chamber and its exposure to air where water, carbon dioxide and other environmental contaminants, such as hydrocarbons will collect upon its surface. Furthermore, we have observed this phenomenon only with regard to the formation of the n+ layer. Therefore, we have concluded that during the purge period accompanying the n+ deposition, during which the silane and phosphine gases are flowed through the plasma chamber to clear it of other gases and to insure a pure ambient (before the plasma has been ignited), the phosphine gas is highly reactive and coats the exposed surface with phosphorus or reacts with surface contaminants, forming surface phosphates thereon, which interfere with bonding.

If the phosphine is introduced directly into a plasma, it will begin to decompose immediately and no free phosphine contamination is possible. It is imperative that the purge step be effected prior to ignition of the plasma. We have determined that the purging with silane alone is effective. Therefore, we bifurcate the known n+ eposition process to effect good n+ layer adhesion and to eliminate the delamination bubbles, regardless of the prior processing history.

Our solution to the prevailing problem provides for purging the plasma chamber, at the initiation of the n+ deposition step, with pure silane, then igniting the plasma, and only subsequently introducing the phosphine. If the plasma extinguishes, it may be relit immediately without a purge. An extremely thin layer of intrinsic amorphous silicon is thereby deposited immediately prior to the deposition of the n+ layer. By maintaining the thickness of the intrinsic amorphous silicon very thin it is possible to cover all the contaminants prior to the n+ deposition.

In a process wherein separate plasma chambers are dedicated to each gas mixture so that they don't cross contaminate, there will be a pure silane chamber and a silane and phosphine mixture doping chamber, in which the gas is about 99% silane and about 1% phosphine. In this case it is not possible to practice our invention as described above. We have found that by growing a layer intrinsic amorphous silicon to a nominal thickness sufficient to cover all the surface contamination, i.e., about 100 ÅA, within the silane chamber, we may move the substrate, under vacuum, into the phosphine doping chamber, purge the chamber in the usual manner, and then deposit the n+ layer. In this case it is more important that the intrinsic layer must be thick enough to form a continuous layer having no voids and covering all the contaminants so that there can be no reaction between the phosphine and surface contaminants. Under these conditions, good adhesion takes place and all delamination bubbles are absent.

Having eliminated the source of poor adhesion, the lifting forces are of no matter because the bonding forces holding the layers together are far larger. The genesis of the lifting forces shall only be described to complete an understanding of the problem. Compressive stresses, causing the film to bubble, are inherent in the mechanics of deposition. For example, differences in the thermal expansion rates of the n+ layer and its underlying layer. Hydrogen pressure, causing the film to bubble, may evolve from underlying layers rich in hydrogen. For example, the bottom silicon nitride and the intrinsic amorphous silicon layers are deposited from hydrogen-containing gases. During the elevated temperature processing, such as annealing and photoresist baking, hydrogen atoms can diffuse out of these films to the n+/top nitride interface where they can recombine to hydrogen gas and produce a gas pressure.

It should be understood that the present disclosure has been made only by way of example and that changes may be resorted to, without departing from the true spirit and scope of the invention as hereinafter claimed.

What is claimed:

1. A method of depositing a thin film n+ amorphous silicon layer, from the decomposition of a gaseous mixture of silane and phosphine, upon the exposed surface of a substrate having one or more thin film layers thereon, wherein there is contamination upon said exposed surface, comprising the steps of placing said substrate in a plasma chamber, flowing silane into said chamber for a purge period, and depositing an n+ amorphous silicon layer upon said exposed surface by igniting a plasma in said chamber, for decomposing said silane and for depositing a protective layer of intrinsic amorphous silicon, of sufficient thickness to cover said contamination, and then flowing a gaseous mixture of silane and phosphine into said chamber, for decomposing said silane and phosphine and for depositing a layer of n+ amorphous silicon upon said protective layer.

2. The method of depositing a thin film n+ amorphous silicon layer as defined in claim 1 wherein said gaseous mixture is flowed into said plasma.

3. The method of depositing a thin film n+ amorphous silicon layer as defined in claim 1 wherein said plasma is extinguished after said protective layer of intrinsic amorphous silicon is deposited and said plasma is reignited after said gaseous mixture is flowed into said chamber.

4. A method of depositing a thin film n+ amorphous silicon layer, from the decomposition of a gaseous mixture of silane and phosphine, upon a substrate having one or more thin film layers thereon, wherein there is contamination upon the exposed surface of the outer thin film layer, comprising the steps of placing said substrate in a first plasma chamber, flowing silane into said first chamber for a first purge period, and depositing an n+ amorphous silicon layer upon said exposed surface by igniting a plasma in said first chamber, for decomposing said silane and for depositing a thin protective layer of intrinsic amorphous silicon, of sufficient thickness to cover said contamination, moving said substrate into a second plasma chamber, flowing a gaseous mixture of silane and phosphine into said second plasma chamber for a second purge period, and igniting a plasma in said second chamber, for decomposing said silane and phosphine and for depositing a layer of n+ amorphous silicon upon said thin protective layer.

\* \* \* \* \*